(12) United States Patent
Seifert

(10) Patent No.: US 6,958,254 B2
(45) Date of Patent: Oct. 25, 2005

(54) METHOD TO PRODUCE GERMANIUM LAYERS

(75) Inventor: Werner Seifert, Lund (SE)

(73) Assignee: BTG International Limited, London (GB)

( * ) Notice: Subject to any disclaimer, the term of this patent is extended or adjusted under 35 U.S.C. 154(b) by 0 days.

(21) Appl. No.: 10/477,130

(22) PCT Filed: Apr. 30, 2002

(86) PCT No.: PCT/GB02/01980

§ 371 (c)(1),
(2), (4) Date: Mar. 23, 2004

(87) PCT Pub. No.: WO02/090625

PCT Pub. Date: Nov. 14, 2002

(65) Prior Publication Data

US 2004/0157412 A1 Aug. 12, 2004

(30) Foreign Application Priority Data

May 8, 2001 (GB) .............................................. 0111207

(51) Int. Cl.$^7$ .............................................. H01L 21/00
(52) U.S. Cl. ........................................ 438/47; 257/11
(58) Field of Search .............................. 117/42, 54, 64, 117/90–102, 935; 257/11–29, 94–103; 438/933, 22, 47, 481, 604–607, 29, 478, 592

(56) References Cited

U.S. PATENT DOCUMENTS

| 5,245,206 | A |   | 9/1993 | Louis et al. |
| 5,259,918 | A | * | 11/1993 | Akbar et al. .................. 117/90 |
| 5,286,334 | A |   | 2/1994 | Shahzad et al. |
| 5,405,453 | A |   | 4/1995 | Frank et al. |
| 6,117,750 | A |   | 9/2000 | Daniel et al. |
| 2002/0075924 | A1 | * | 6/2002 | Mukai ......................... 372/45 |

FOREIGN PATENT DOCUMENTS

| DE | 195 22 054 | 11/1996 |
| EP | 0 518 800 | 12/1992 |
| FR | 2 783 254 | 3/2000 |
| JP | 10-289996 | 10/1998 |
| WO | WO 99 19546 | 4/1999 |

* cited by examiner

Primary Examiner—David Nelms
Assistant Examiner—Calvin Lee
(74) Attorney, Agent, or Firm—Miles & Stockbridge P.C.

(57) ABSTRACT

A method of producing a very large area germanium layer on a silicon substrate, comprises forming an initial layer of germanium on the silicon substrate such that rounded S—K protuberances are produced by lattice mismatch. Oxidation produces silicon dioxide between the protuberances, and a subsequent reduction step exposes the tops of the protuberances. Since the top regions are almost perfectly relaxed and free of stress, these form nucleation sites for the subsequent growth of a final layer of germanium, formed as single crystals each extending from a nucleation site.

38 Claims, 8 Drawing Sheets

Step 2 -Surface oxidation:

Step 4 -Epitaxial lateral overgrowth (ELO) by Ge:

STEP 1: SELF-ASSEMBLING Ge DOTS IN UHV-CVD

STEP 2: SURFACE OXIDATION BY INSERTING $H_2O$

STEP 3: REDUCTION $GeO_2 + H_2 \dashrightarrow Ge$

STEP 4: EPITAXIAL LATERAL OVERGROWTH (ELO) BY Ge

50

Fig. 8A. Step 1 - Self-assembling Ge dots in UHV-CVD:
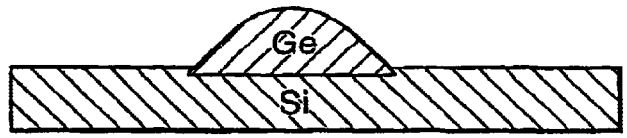
Fig. 8B. Step 2 - Surface oxidation:
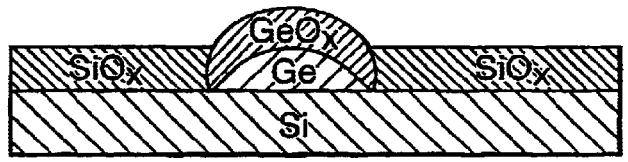
Fig. 8C. Step 3 - Reduction $GeO_2 + H_2 \longrightarrow Ge$:
Fig. 8D. Step 4 - Epitaxial lateral overgrowth (ELO) by Ge:
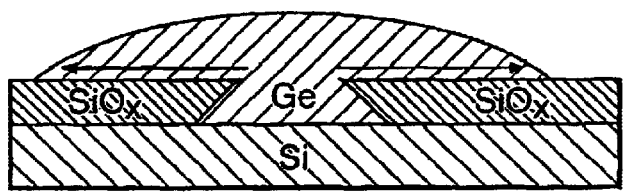
Fig. 8E.
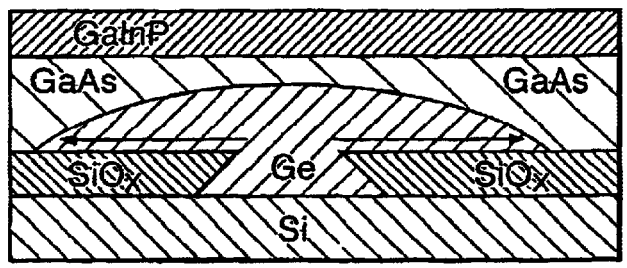

METHOD TO PRODUCE GERMANIUM LAYERS

The present invention relates to a method of producing layers of germanium and other materials, principally on silicon substrates.

Whereas the pioneering work in microelectronics was Germanium-based (see the first transistor in 1947) the advantages of Silicon (low cost, native isolating oxide, technology development) led to the dominating position of silicon in modern microelectronics. There are today only a few applications for germanium substrates, for example high efficiency solar cells of the type GaInP/GaAs/Ge. It is the high cost of germanium substrates which prevents the use of such solar cells for terrestrial applications (Compound Semiconductor 1999, 5 (9), page 40 and 2001, 7(1), page 82).

Nevertheless there are a few advantages of germanium, too, especially the higher carrier mobility in comparison to silicon. Therefore, there has been considerable research in improving silicon substrates for electronic devices, by applying on the substrate surface a SiGe alloy layer, having the form $Si_{(1-x)}Ge_x$. There is a 4.2% difference in the lattice constants of silicon and germanium. Hence if thicker layers of SiGe on silicon substrates are desired strain-induced dislocations are unavoidable. By growing a gradient layer with increasing Ge in a first step these misfit dislocations can be concentrated within this gradient layer. The further growth of a constant composition GeSi layer in the second step can then be continued with lower concentrations of dislocations. In general, this method needs depositions of gradient SiGe and constant SiGe in the order of $\mu$m thickness. Methods of depositing Ge on Si substrates are disclosed for example in U.S. Pat. No. 5,286,334 and U.S. Pat. No. 6,117,750.

WO-A-99/19546 discloses theoretical investigations for growing threading dislocation-free heteroepitaxy. The proposed method involves forming on an Si substrate a layer of a material with a different lattice constant. This creates bumps in the layer, known as Stranski-Krastanov islands, arising from buckling of the layer under strain. Dislocations around the bumps are removed, allowing further defect-free growth of the islands, eventually to form a continuous layer. This is essentially a theoretical analysis, and there is no evidence that the method has been, or could be, implemented in practice, since the resultant structure has an interface between two materials of different lattice constant. This would result in immense strains set up at the interface, with no means of relieving the strains.

SUMMARY OF THE INVENTION

It is an object of the invention to provide an improved method for producing germanium or other layers of large area.

In a first aspect, the present invention provides a method of producing a layer of a desired material, the method comprising:
a) providing a substrate of silicon, having a different lattice constant from said desired material, and depositing said desired material on the substrate such that rounded protuberances are produced;
b) filling the areas between the protuberances with a non-crystalline material; and
c) depositing again said desired material, the rounded protuberances serving as growth sites whereby to produce a layer of said material.

In a second aspect, the invention provides a semiconductor structure comprising a substrate of silicon, protuberances of a desired material formed on the substrate surface, said protuberances having a rounded shape, and the desired material having a different lattice constant from that of silicon, a layer of non-crystalline material being formed between the protuberances, and a layer of said desired material being formed on top of, and in contact with, the rounded protuberances.

The layer of material is essentially formed in step c) as single crystals extending from each protuberance. Depending on the intended application, the crystals may extend to form a more or less continuous layer; alternatively the growth may continue to form a layer of uniform thickness.

The protuberances may be formed on the substrate in any desired way. For example the substrate may be prepared to define sites on which the desired material may be deposited, by lithography or other methods (for example, that described in our copending application WO 01/84238). However it is preferred to grow an initial layer of the material uniformly on the substrate, and this creates in known manner, once the layer exceeds a certain thickness, Stranski Krastanov (SK) pyramidal shaped bumps caused by buckling of the layer under strain. In accordance with the invention, these pyramidal-shaped bumps are increased in size until they become rounded in shape, in the form of a dome. In accordance with the invention the growth of the initial layer is carried out in steps of pre-determined duration, as described in more detail below, so that only rounded bumps remain and substantially all the pyramidal shaped bumps no longer exists. The advantage of using larger rounded bumps is that the lattice spacing at the top of the bump is substantially that of the desired material, since the lattice structure at the top of the bump is substantially relaxed.

In accordance with the invention, the material preferably comprises germanium. Alternatively, the germanium may be replaced by a suitable alloy of germanium and silicon, $Ge_xSi_{1-x}$.

The substrate on which the germanium layer is formed is silicon, since silicon is a very cheap material and can be produced in wafers approaching 12 inches wide. In a modification of the invention, substrates other than silicon may be employed.

Thus it is possible in accordance with the invention to produce a very large area layer of germanium, as wide as that of a silicon wafer, and hence the costs of producing electronic devices on the germanium layer are correspondingly reduced. Thus the present invention is very suitable for use as a compound solar cell comprising Ge/GaAs/GaInP. Solar cells do not require a single crystal formation in the layer of germanium, i.e. pure epitaxial growth of the germanium layer. Solar cells will function perfectly adequately with polycrystalline growth, i.e. a layer in which the current flow laterally over the length of the germanium layer is interrupted. Nevertheless, it is possible in accordance with the invention to achieve epitaxial growth of the germanium layer. In order to do this, it is necessary to prevent, as more fully described below, contamination of the surfaces of said protuberances are free from contamination from substances such as silicon, which would otherwise prevent epitaxial growth from the individual protuberances.

BRIEF DESCRIPTION OF THE DRAWINGS

Preferred embodiments of the invention will now be described with reference to the accompanying drawings wherein:

FIG. 8 shows four sequential steps diagrammatically in the production of a germanium layer in accordance with a second embodiment of the invention.

DESCRIPTION OF THE PREFERRED EMBODIMENTS

In at least the preferred embodiment self-assembled Ge-dots are produced on Si(001) substrates in UHV-CVD, a stable oxide mask (SiO$_2$) will be created in the area between the dots, the GeO$_2$ on top of the Ge-dots will be reduced by H$_2$ and finally, the Ge-dots are used as the seeds for epitaxial lateral overgrowth of the SiO$_2$ with Ge. The whole process is based on self-organisation, i.e. no special processing steps will be necessary. The result will be a structure of Ge (or Ge$_x$Si$_{1-x}$) on Si. The formed Ge-layer can be thin and can be a base for further deposition of, for instance, GaAs/GaInP on top of it.

Figure 1A:
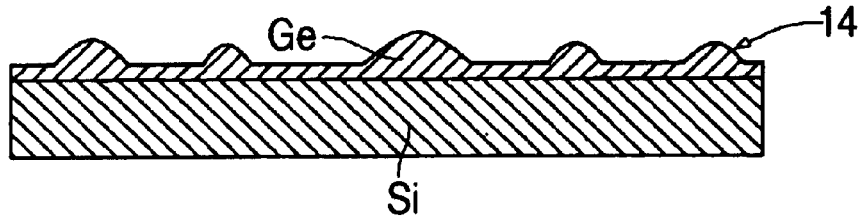
FIG. 1 shows four sequential steps diagrammatically in the production of a germanium layer in accordance with a first embodiment of the invention.
Figure 1B:
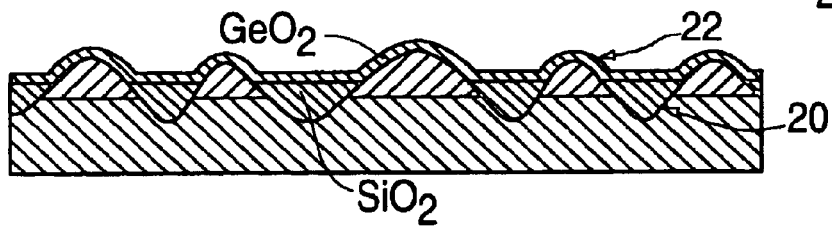
Figure 1C:
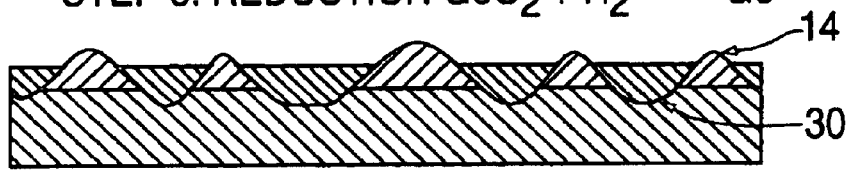
Figure 1D:
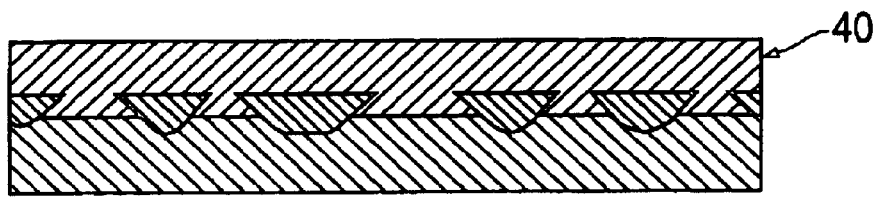
Figure 2:
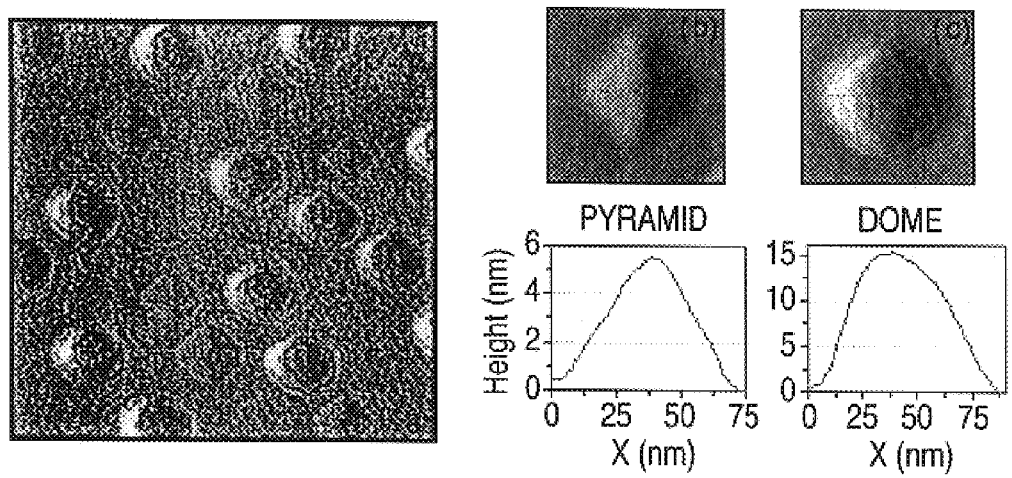
FIGS. 2, 3 and 4 are views of the rounded protuberances formed in step 1 of FIG. 1.

Referring now to FIGS. 1 and 2 a thin layer of germanium is formed on a silicon substrate having a face on the <001> plane under ultrahigh vacuum conditions by a chemical vapour deposition process. Under these conditions, self-assembled SK pyramidal-shaped dots 14 are formed in the germanium layer, between 4 and 6 nanometers high. Upon continued growth, these dots have a rounded form and are between 12 and 20 nanometers high, and between 60 and 100 nanometers wide. A unimodal dome-shaped island population is achieved for the self-assembled Ge/Si(001) dots grown by ultra-high vacuum chemical vapour deposition (UHV-CVD) at T=620° C. A step-wise growth mode is applied, consisting of two Ge deposition steps with a short growth interruption in between. In the first step a "base structure" with pyramids and domes is grown while in the second one an additional Ge amount at reduced pressure is supplied. Selective "feeding" of only the pyramids and their conversion into domes occurs In the SK effect, there are three distinct island shapes that are named "pyramids", "domes" and "superdomes" (S. A. Chaparro, Y. Zhang, J. Drucker, D. Chandrasekhar, and D. J. Smith, J. Appl. Phys. 87, (2000) 2245; G. Medeiros-Ribeiro, T. I. Kamins, D. A. A. Ohlberg, and R. S. Williams, Phys. Rev. B 58 (1998) 3533). Pyramids are small volume islands that are bounded by four equal {105} facets forming a contact angle of 11° with the Si(001) substrate. Domes, larger volume islands, are multifaceted structures bounded by steeper {113} facets and other various facets with contact angle near 25°. Both, pyramids and domes are coherent (i.e. dislocation free) islands. Superdomes are the largest, no longer coherent islands, that have {111} facets and other facets in addition at the boundary with the substrate. As growth proceeds, searching for minimization of the free energy of the system, the islands go through shape transitions from pyramids to domes or domes to superdomes. Over a wide range of growth conditions the spontaneously formed 3-dimensional (3D) islands show a bimodal size distribution, containing pyramids and domes coexisting even for long times of annealing. In the SK effect, the dots produced have a lattice constant at the silicon substrate corresponding to that of silicon, but as the germanium extends away from the substrate, the strain in the germanium lattice gradually relaxes so that at the top of the dots, the lattice constant approaches that of germanium. Thus when a subsequent layer of germanium is formed on the top of the dots, the lattice dimensions of the top layer are equal to that of the natural lattice constant of germanium without strain. Therefore no dislocations are produced.

Figure 3:
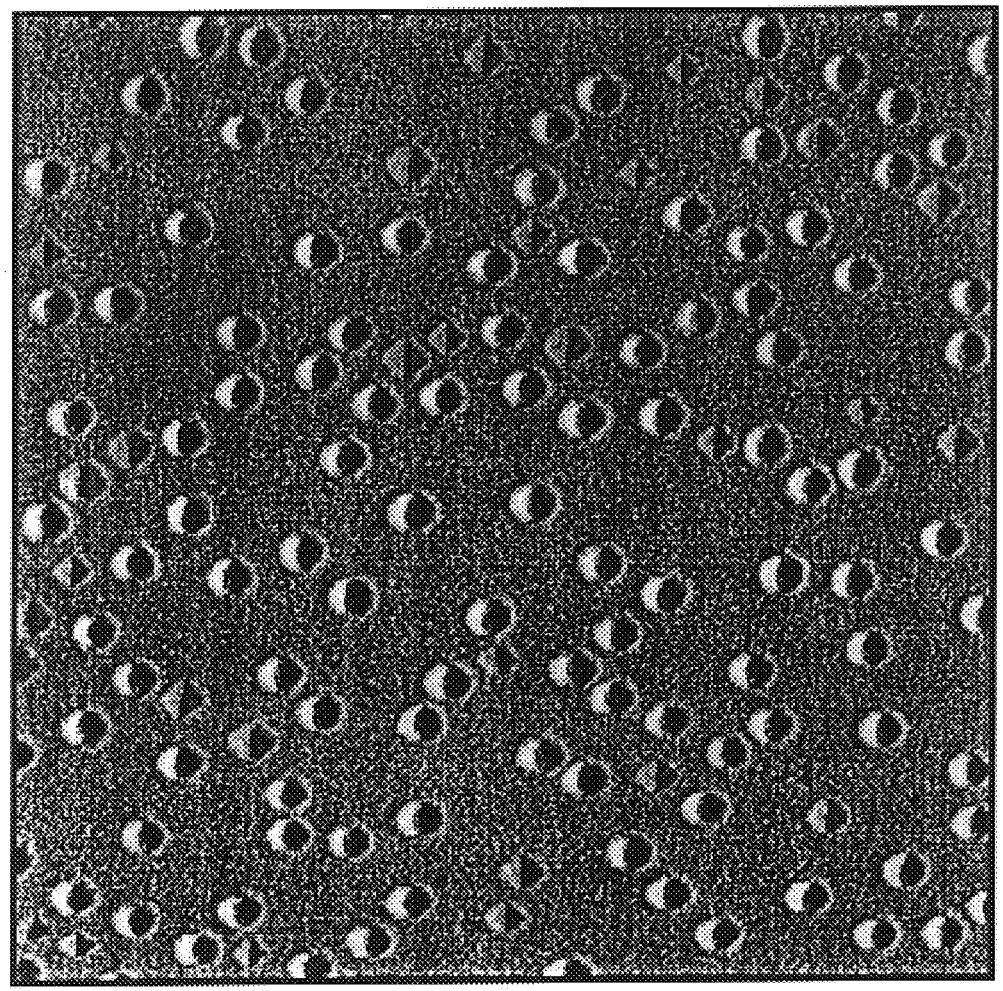

As shown in FIG. 2, the protuberances have a bimodal size distribution, with smaller protuberances having a generally pyramid profile and growing to a height of up to 6 nanometers. The rounded protuberances grow to a greater height. It is desired to ensure that all the pyramid-shape protuberances are removed. In accordance with a preferred method, the pyramid protuberances are enlarged in a second step of germanium deposition wherein germanium is deposited for a short time period of 57 seconds at a pressure of 2×10$^{-4}$ mbar, then followed by deposition at 1.1×10$^{-4}$ mbar for a time period of 8 seconds. FIG. 3 is a further view of the bimodal distribution, with a lower density of pyramids.

Figure 4:
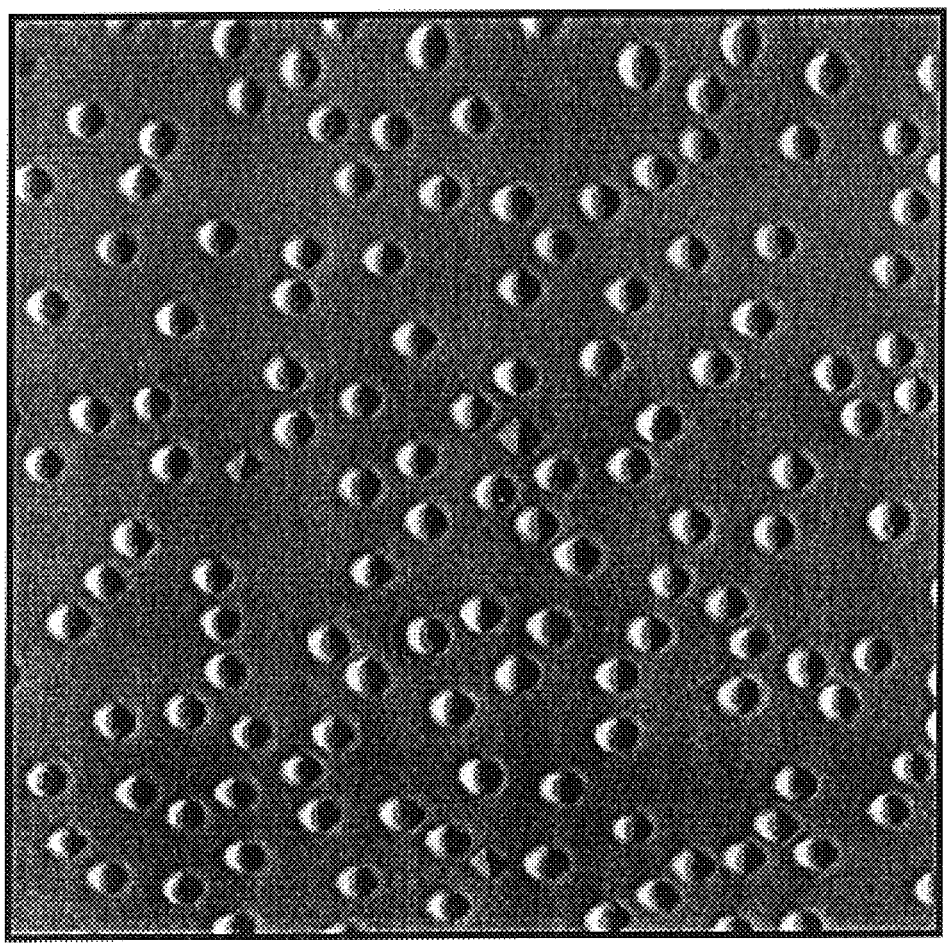

This step-wise method of growth of protuberances is effective in eliminating, for practical purposes, the small pyramid-shaped projections. FIG. 4 is a view of the protuberances, with the pyramids essentially removed.

Referring to FIG. 1B, in step 2 the substrate and germanium layer are oxidised by applying a nitrogen gas saturated with water at a temperature of 500° C. for 0.5 hours. This oxidises the germanium layer to produce germanium dioxide, and also oxidises the underlying silicon substrate in the regions between the protuberances to produce silicon dioxide. Since the silicon dioxide expands, the resultant structure as shown in FIG. 1 has regions 20 full of silicon dioxide between the dots 14 and an overlying layer of germanium dioxide 22. The oxidation effect of germanium is small since germanium forms a wetting layer at the surface with a thickness of only a few monolayers In step 3, a reduction process is carried out wherein the germanium dioxide is reduced by application of hydrogen. The result as shown in FIG. 1C is to produce germanium dots or protuberances 14 surrounded by islands of amorphous silicon dioxide 30. Reduction by hydrogen at temperatures below 800° C. does not attack the silicon dioxide layer because of the higher thermo chemical stability of silicon dioxide. Since these amorphous regions 30 do not provide a lattice construction to which germanium will register, a further deposition process of germanium by MOCVD, as shown in FIG. 1D, step 4, will produce germanium nucleating on the germanium protuberances 14 and extending between protuberances to produce a layer of germanium 40 of perfect crystallinity.

Although this preferred embodiment has been described with reference to the production of germanium, the method is also applicable to producing compound layers of silicon and germanium.

A specific example of the process of FIG. 1 will now be given:

EXAMPLE

Step 1, self-assembling Ge-dots: The growth of almost uniform dome-shaped Ge-islands on Si(001) according to FIG. 1A, step 1, was performed by a two-step growth procedure using ultra-high-vacuum chemical vapor deposition (UHV-CVD). Silane (SiH$_4$) and germane (GeH$_4$, 10% diluted in H$_2$) were used as source materials. We used substrates cleaved from (001) oriented n-doped Si wafers. First the samples were cleaned in organic solvents and sonicated in ultrasound bath. After Piranha etching in a 3:1 H$_2$SO$_4$/H$_2$O$_2$ mixture for 5 min, the substrates were treated in a solution of diluted HF (5%) for 45 s to remove the native oxide and hydrogen-passivate the surface. The wafers were then inserted into the reactor at 450° C. and a 45 nm thick Si buffer layer was grown during ramping up to the Ge deposition temperature of 620° C. After a growth interruption of 15 s the first Ge amount was deposited during a time of 72 sec at a GeH$_4$ pressure of $2 \times 10^{-5}$ mbar. Atomic force microscopy (AFM) measurements show for samples grown with only one deposition step the typical bimodal size distribution of Ge-dots with smaller pyramids and larger domes (FIG. 2).

In order to selectively convert all the pyramids into domes, without creating new nucleation sites, we have used a two-step growth process, where in the second step, after a period of 1 minute of growth interruption, for 14 sec a controlled additional amount of Ge is supplied at a lower GeH$_4$ pressure of $2 \times 10^{-4}$ mbar (lower supersaturation) to selectively "feed" the pyramids and to suppress the formation of new 3-D islands. The results of the step-wise growth are shown in FIG. 3. Typically almost all the pyramids can be converted into dome-shaped islands. Samples of this morphology were then used for the further oxidation/reduction and overgrowth experiments according to steps 2, 3 and 4 in FIG. 1.

Step 2, surface oxidation: This step (FIG. 1B) is to perform under very gentle conditions. The best results were obtained by taking off the sample from the reactor cell, exposing it to air at room-temperature for 60 min and putting it back to the reactor. The native oxide which grows under such conditions on the surface is about 2 nm thick. It covers also the Ge-dots, whereby due to the incorporation of Si as an impurity into the dots the formed oxide is a mixture of GeO$_x$ and SiO$_x$.

Step 3, selective reduction: This step (step 3 in FIG. 1C) was done in the UHV-reactor cell at a temperature of 600° C. by filling the cell with H$_2$ over a time of 60 min. The reduction process started with a H$_2$-pressure of 0 and was then linearily ramped up to 600 Torr at the end of the reduction process. Subsequently, the H$_2$ was pumped away.

Figure 5:
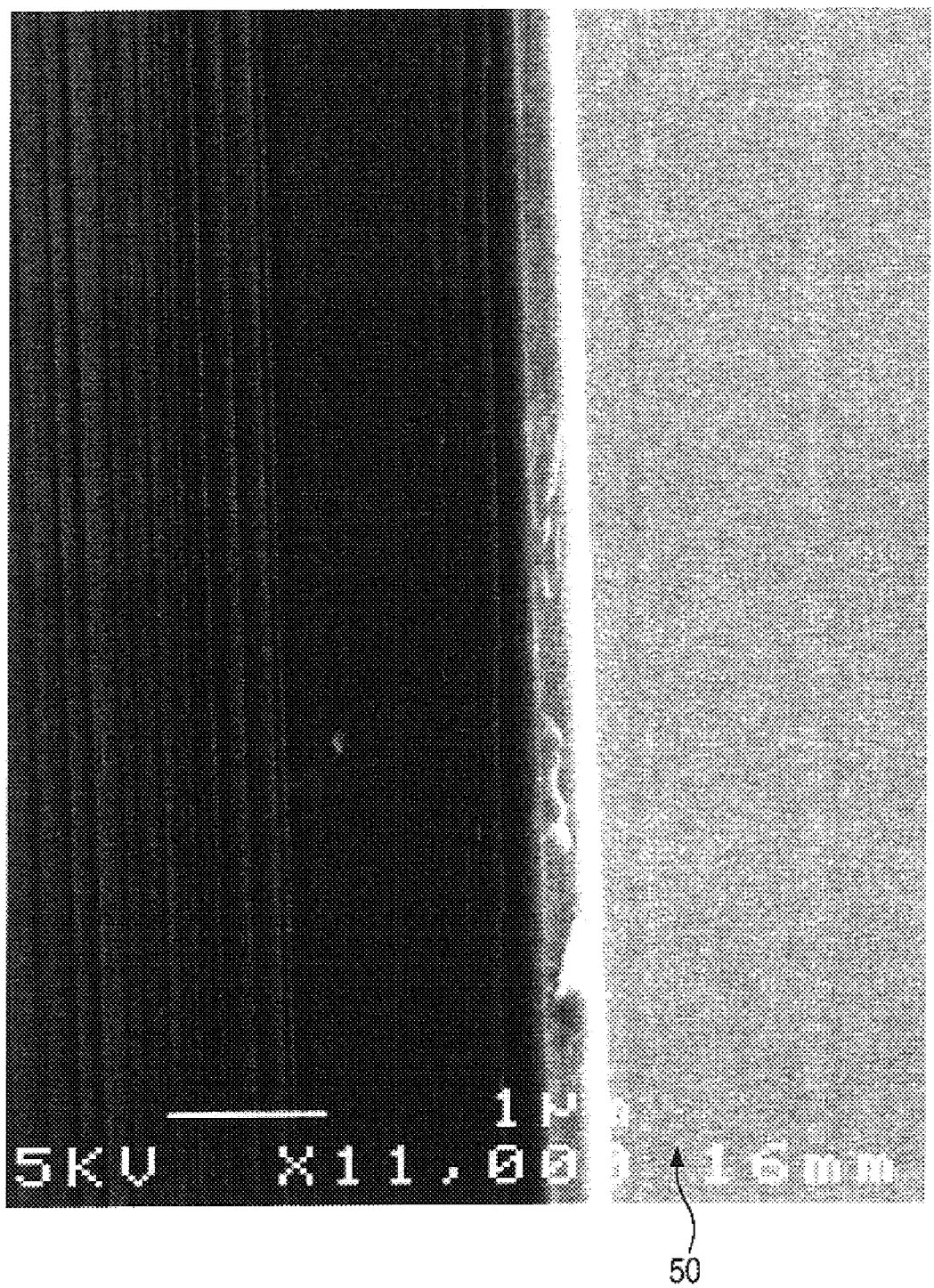
FIGS. 5 and 6 are views in crossection of a germanium layer formed on a silicon substrate by the process of FIG. 1.
Figure 6:
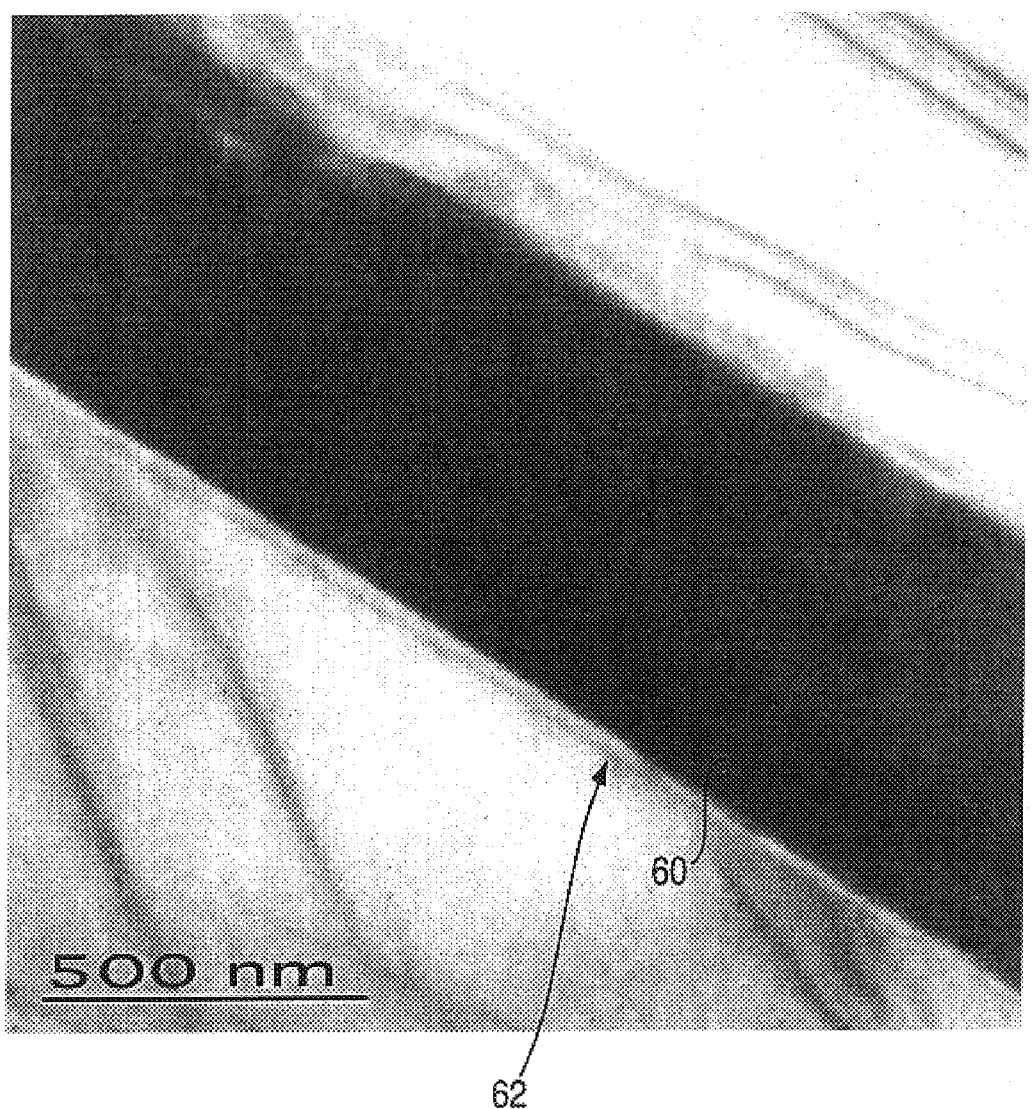

Step 4, epitaxial lateral overgrowth: This step (step 4 in FIG. 1) was done immediately after step 3 had finished and the H$_2$ was pumped out of the reactorcell down to a pressure of $<1$–$10^{-6}$ mbar. After this the GeH$_4$ was switched on and the nucleation of Ge on top of the former Ge-dots started. In order to restrict the Ge-nucleation to only areas where single-crystalline Ge phases can act as the seeds the GeH$_4$-pressure for the first 10 min of deposition was kept on a low value of $2 \times 10^{-6}$ mbar. In order to deposit thicker layers the GeH$_4$-pressure was finally increased to $6.8 \times 10^{-4}$ mbar for further 50 min of deposition. Under these conditions about 400 nm of Ge could be deposited as a layer, as shown in FIGS. 5 and 6. FIG. 5 is a Scanning Electron Micrograph (SEM) image of the cleavage plane. The bright layer 50 is Ge. FIG. 6 is a Transmission Electron Micrograph (TEM) image of a similar area. The dark layer 60 is Ge. The dark stripe 62 close to the Si-surface (about 45 nm away from the Ge) is caused by some Ge incorporation at the beginning of deposition (a memory effect from previous runs).

Figure 7:
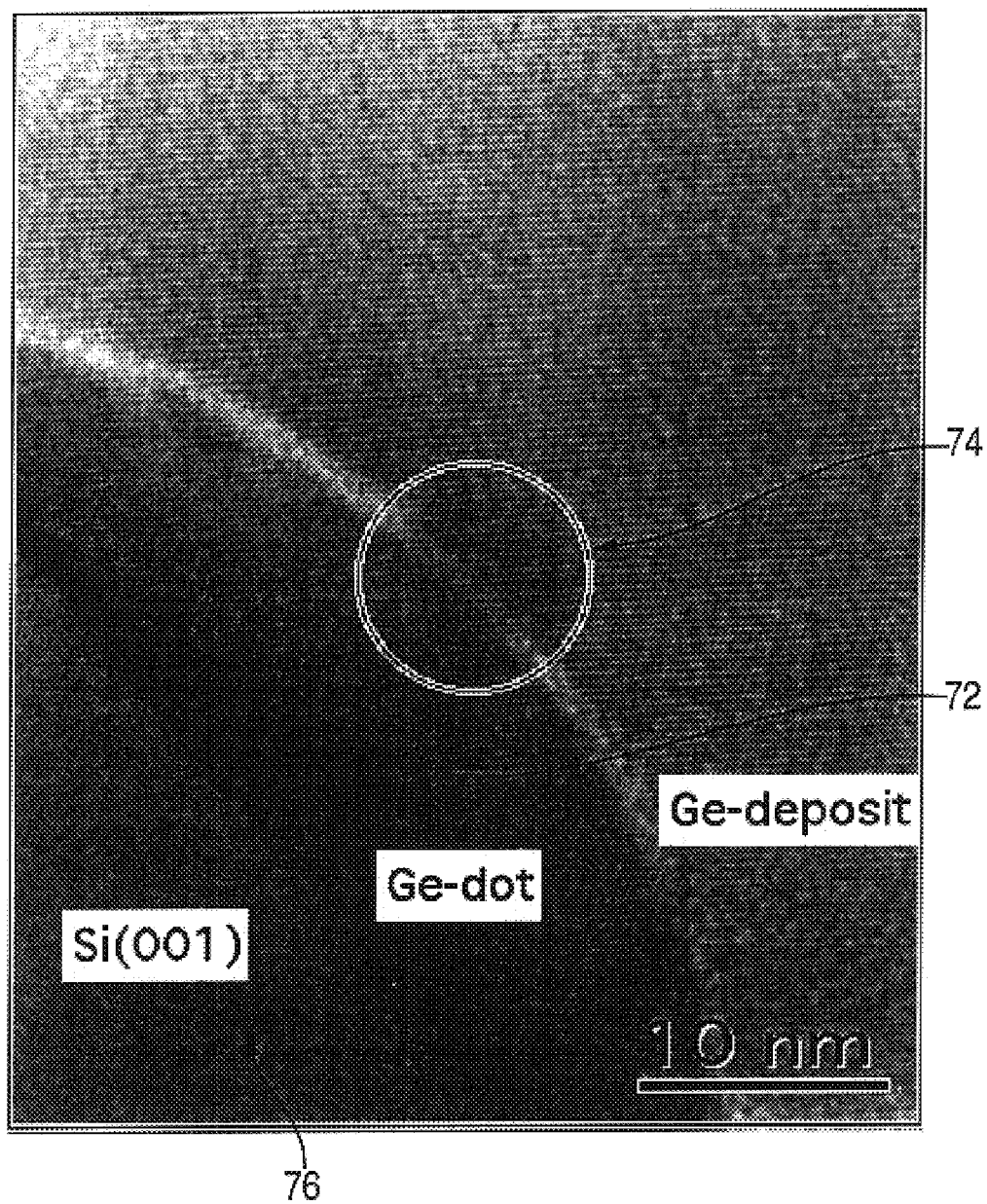
FIG. 7 is an enlarged view of a germanium protuberance with epitaxial growth of a layer of germanium thereon.

FIG. 7 shows. a single-crystalline deposition 70 of Ge on top of an oxidized/reduced/overgrown Ge-dot 72. The nucleation started in the area marked with a circle 74. Starting from this point lateral overgrowth of the oxide 76 occurs. The oxide comes from the contamination of Ge-dots with Si, i.e. it is mainly SiOx which does not reduce in the H2-atmosphere. Thus the epitaxial information between the former Ge-dot and the deposited Ge is transferred close to the top of the former dot. Here the lattice planes of the single-crystalline Ge-rich material 70 penetrate the oxide layer 76.

Referring now to FIG. 8 there is shown a second embodiment of the invention wherein steps 1, 2 and 3 are essentially the same as that for FIG. 1.

In step 4 however, germanium is grown on the tops of the rounded domes by epitaxial lateral overgrowth. The area of deposited germanium extending from each dome site forms a single crystal. Since the intended application of the germanium layer is for a solar cell, only vertical movement of the electrons in the germanium layer is of interest between the various layers other solar cell. Therefore it is not necessary for the single crystals extending from each dome site to coalesce with adjacent crystals from adjacent dome sites in order for the solar cell to work properly. Therefore in this embodiment the upper layer of germanium comprises regions of single cells which more or less cover the entire area of the substrate and form a layer. FIG. 8E shows a schematic view of a completed solar cell incorporating the second embodiment.

What is claimed is:

1. A method of producing a layer of a desired material, the method comprising:
    a) providing a crystalline substrate having a different lattice constant from said desired material, and depositing said desired material on the substrate such that protuberances having rounded upper surfaces are produced;
    b) filling the areas between the protuberances with a non-crystalline material; and
    c) depositing again said desired material, the protuberances serving as growth sites whereby to produce a layer of said desired material.

2. A method as claimed in claim 1, wherein the depositing in step a) includes depositing a layer of said desired material on the substrate, wherein the layer of desired material is grown sufficiently such that the protuberances are produced in the layer.

3. A method according to claim 2, wherein said layer of said material is deposited in such a way that only protuberances having rounded upper surfaces are produced, and pyramidal-shaped protuberances are suppressed.

4. A method according to claim 3, wherein said layer of said material is produced on the substrate by a series of step depositions by chemical vapour deposition, so that the protuberances produced are of a uniform size distribution.

5. A method according to claim 4, wherein said desired material is deposited by a chemical vapour deposition process, wherein in a first stage one or more of the constituent materials is supplied at a predetermined pressure, and, after a period of growth interruption, in a second stage the pressure of said constituent materials is decreased.

6. A method according to claim 5, wherein the constituents of the chemical vapor deposition process are Silane and Germane, and the pressure of Germane is reduced in the second stage.

7. A method according to claim 5, wherein the temperature of the process is roughly 600° C., the period of the first stage is roughly one minute, the period of growth interruption is roughly one minute, and the period of the second stage is roughly one quarter of a minute.

8. A method according to claim 2, wherein the protuberances have at their base a lattice constant corresponding to that of the underlying substrate material, and at their tops, a lattice constant corresponding to that of the desired material.

9. A method according to claim 1, wherein in step (b) areas of amorphous of silicon dioxide are produced between the protuberances by oxidation.

10. A method according to claim 9, wherein the oxidation process is carried out under atmospheric conditions, and at room temperature.

11. A method according to claim 9, wherein the desired material is reduced by application of hydrogen at an elevated temperature, whereby to expose the upper surfaces of the protuberances separated by areas of silicon dioxide.

12. A method according to claim 1, wherein said desired material comprises germanium.

13. A method according to claim 1, wherein the layer of desired material formed on said protuberances extends from each protuberance by epitaxial growth as a single crystal, to form a continuous layer extending over the substrate.

14. A method according to claim 1, wherein the growth of the layer on the protuberances is continued to form a layer of uniform thickness.

15. A method according to claim 1, wherein a crystalline substrate comprising silicon is employed.

16. A method according to claim 1 used to produce a germanium substrate in a solar cell.

17. A semiconductor structure comprising:
   a substrate of silicon,
   protuberances of a desired material formed on a surface of the substrate, said protuberances having rounded upper surfaces, and the desired material having a different lattice constant from that of silicon,
   a layer of non-crystalline material being formed between the protuberances, and
   a layer of said desired material being formed on top of and in contact with, the protuberances.

18. A structure according to claim 17, wherein the desired material is germanium.

19. A structure according to claim 17, wherein said layer of desired material is epitaxially formed from each, or at least the greater part of, the protuberances.

20. A method of producing a layer of a desired material, the method comprising:
   a) providing a crystalline substrate having a different lattice constant from said desired material;
   b) producing on the substrate protruding nanostructures having rounded upper surfaces and comprising the desired material;
   c) providing a non-crystalline material in areas between the nanostructures; and
   d) depositing said desired material over the substrate, the nanostructures serving as growth sites whereby to produce said layer of said desired material.

21. A method according to claim 20, wherein the nanostructures have at their base a lattice constant corresponding to that of the underlying substrate material, and toward their tops, a lattice constant corresponding to that of the desired material.

22. A method according to claim 20, wherein in step (c) areas of amorphous silicon dioxide are produced between the nanostructures by oxidation.

23. A method according to claim 22, wherein the crystalline substrate comprises silicon.

24. A method according to claim 22, wherein the oxidation process is carried out under atmospheric conditions, and at room temperature.

25. A method according to claim 22, wherein the desired material is reduced by application of hydrogen at an elevated temperature, whereby to expose the upper surfaces of the nanostructures separated by areas of silicon dioxide.

26. A method according to claim 20, wherein said desired material comprises germanium.

27. A method according to claim 26, wherein the crystalline substrate comprises silicon.

28. A method according to claim 20, wherein the layer of desired material formed on said nanostructures extends from each nanostructure by epitaxial growth as a single crystal, to form a continuous layer extending over the substrate.

29. A method according to claim 20, wherein the growth of the layer on the nanostructures is continued to form a layer of uniform thickness.

30. A method according to claim 20, wherein the crystalline substrate comprises silicon.

31. A method according to claim 20 used to produce a germanium substrate in a solar cell.

32. A solar cell having a germanium substrate produced by the method of claim 31.

33. A semiconductor structure comprising a crystalline substrate material, protruding nanostructures of a desired material formed on a surface of the substrate material, said nanostructures having rounded upper surfaces, and the desired material having a different lattice constant from that of the substrate material, a layer of non-crystalline material being formed between the nanostructures, and a layer of said desired material being formed in contact with the nanostructures.

34. A structure according to claim 33, wherein the desired material comprises germanium.

35. A structure according to claim 34, wherein said layer of desired material is epitaxially formed from each, or at least the greater part of, the nanostructures.

36. A structure according to claim 35, wherein the substrate material comprises silicon.

37. A structure according to claim 34, wherein the substrate material comprises silicon.

38. A structure according to claim 33, wherein the substrate material comprises silicon.

* * * * *